United States Patent
Chen et al.

(10) Patent No.: US 6,660,436 B1
(45) Date of Patent: Dec. 9, 2003

(54) OPC-LIKE REPAIR METHOD FOR ATTENUATED PHASE SHIFT MASKS

(75) Inventors: Same-Ting Chen, Hsinchu (TW); Wen-Hong Huang, Hsin-Chu (TW); Wen-Reng Huang, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 181 days.

(21) Appl. No.: 09/953,609

(22) Filed: Sep. 17, 2001

(51) Int. Cl.[7] .................................................. G03F 9/00
(52) U.S. Cl. ............................................................ 430/5
(58) Field of Search ............................ 430/5, 311, 322, 430/296; 716/19, 20

(56) References Cited

U.S. PATENT DOCUMENTS

| | | | |
|---|---|---|---|
| 5,272,024 A | 12/1993 | Lin | 430/5 |
| 5,506,080 A | 4/1996 | Adair et al. | 430/5 |
| 5,965,306 A | * 10/1999 | Mansfield et al. | 430/22 |
| 6,016,357 A | 1/2000 | Neary et al. | 382/144 |
| 6,077,310 A | * 6/2000 | Yamamoto et al. | 716/19 |

* cited by examiner

*Primary Examiner*—S. Rosasco
(74) *Attorney, Agent, or Firm*—George O. Saile; Stephen B. Ackerman; Rosemary L. S. Pike

(57) ABSTRACT

A new process for repairing an attenuated phase-shifting photomask is described. A contact hole pattern is provided on an attenuating phase-shifting photomask. An aerial image is obtained of the contact hole pattern. The critical dimension of the contact hole pattern is predicted from the intensity of the aerial image. Thereafter, the critical dimension is adjusted by forming non-printable optical proximity or scattering bar correction patterns around abnormal defects in the contact hole pattern on the attenuated phase-shifting photomask. The non-printable correction patterns enhance or cancel light intensity to correct the adnormal defects.

16 Claims, 2 Drawing Sheets

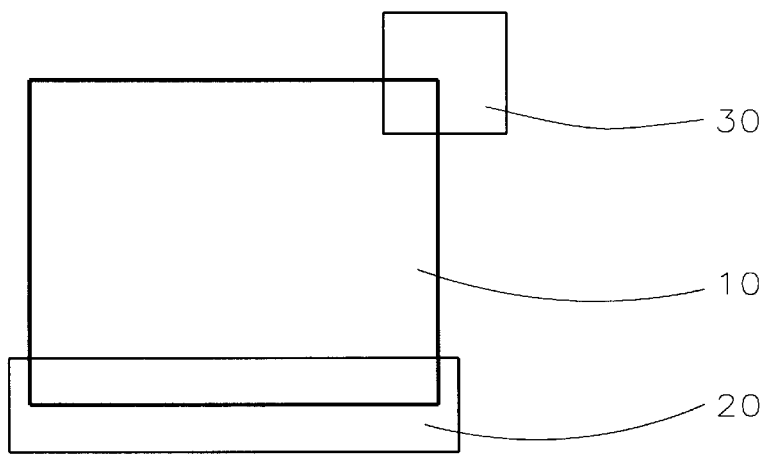
FIG. 1 Prior Art
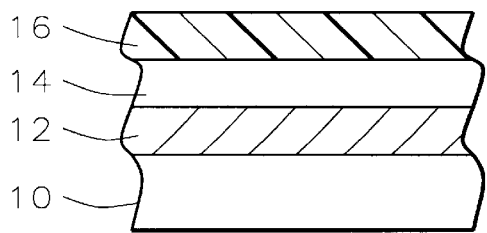  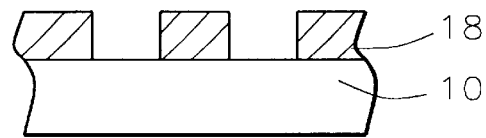
FIG. 2A          FIG. 2B

OPC-LIKE REPAIR METHOD FOR ATTENUATED PHASE SHIFT MASKS

BACKGROUND OF THE INVENTION

1. Field of the Invention

The invention relates to a process for fabricating a photomask, and more particularly, to a process for repairing phase-shifting photomasks.

2. Description of the Prior Art

For next generation and future technology, mask making is one of the bottlenecks. Phase shift masks take advantage of the interference effect in a coherent or partially coherent imaging system to reduce the spatial frequency of a given object, to enhance its edge contrast, or both. It is possible to control locally the type of interference, destructive or constructive, at critical locations in a design by adding an additional patterned layer of transmitting material on the mask. This technique results in a combination of higher resolution, larger exposure latitude, and larger depth-of-focus. In phase shift lithography, a transparent coating is placed over a transparent area. The light waves passing through the coated region are delayed 180° out of phase with the light waves passing through the uncoated region. At the edge of a phase-shifted area, the light waves from the phase-shifted and clear areas will cancel out producing a more sharply defined interface.

An attenuated phase shifting mask (APSM) includes an attenuator which is a metallic-like light absorbing film such as molybdenum silicide oxynitride (MoSiON) or chromium oxynitride (CrON) which allows 5–15% light transmittance. The partial transmittance of the light waves through the attenuator allows for phase shifted light to be produced.

As critical dimension decreases, defects can occur in the making of masks, necessitating repairs. The repair performance of a mask is a key issue in controlling critical dimension and process windows after lithography. Repair machines have limits to their accuracy and capability for repairing advanced masks. One current method of mask repair is by focused ion beam (FIB). For example, to achieve a smaller critical dimension size for a larger pattern such as a contact hole, a clear area is deposited. To achieve a larger critical dimension size for a smaller pattern, the dark area is etched. FIG. 1 illustrates a top view of a photomask pattern 10. 20 and 30 are types of repairs made on the uncoated area.

This FIB method can result in problems. The deposition method can result in over-deposition to produce blind contact holes or reduced critical dimension size. Or the repairs may have damaged the uncoated area. Thus, defects may need to be repaired several times. This will reduce throughput and may result in damage to the quartz substrate if several etching processes are required to recover the critical dimension size of the defect. The current deposition/etching repair methods are hard to control for smaller featured patterns. The copy method of the current FIB repair machine cannot work for abnormal defects in which the image of the FIB from the repair machine is the same as the normal pattern, but the aerial image's measurement from a microlithography simulation microscope (MSM) is totally out of specification for the critical dimension size. That is, although the contact hole size is correct, the abnormal holes may not get enough light intensity compared to normal holes because of residues on uncoated areas or non-uniform dry etching on uncoated areas, for example.

U.S. Pat. No. 5,443,931 to Watanabe discloses a method to repair defects in a mask where resist is used to fill in dent defects and to form sloped sidewalls around bump defects. U.S. Pat. No. 5,272,024 to Lin discloses a PSM having three layers of phase-shifting material. Repairs are made by etching away one or more of the phase-shifting layers. U.S. Pat. No. 5,506,080 to Adair et al teaches a method of observing defects in the resist layer formed on a mask. The defects are repaired in the resist layer, then the repaired pattern is transferred to the mask layer. U.S. Pat. No. 6,016,357 to Neary et al uses aerial image measurement to determine the presence of defects. Patches are added to repair the defects. Patches could be corners or anchors of patch material in clear areas to provide optical proximity correction (OPC).

SUMMARY OF THE INVENTION

Accordingly, it is a principal object of the present invention to provide an effective and very manufacturable process for repairing a photomask.

Another object of the present invention is to provide a process of repairing a phase-shifting photomask.

Yet another object of the present invention is to provide a process of repairing a binary photomask.

Another object of the present invention is to provide a process of repairing an attenuated phase-shifting photomask wherein the critical dimension variation can be predicted during repair.

A further object of the present invention is to provide a process of repairing a photomask wherein distorted patterns are repaired.

A still further object of the present invention is to provide a process of repairing a photomask wherein substrate damage during repair is minimized.

A still further object of the present invention is to provide a process of repairing an attenuated phase-shifting photomask wherein quartz-damaged patterns are recovered by aerial light's contribution of optical proximity correction scattering bar pattern.

Yet another object of the present invention is to provide a standardized process of repairing an attenuated phase-shifting photomask for critical dimension control.

In accordance with the objects of this invention a new process for repairing an attenuated phase-shifting photomask is achieved. A contact hole pattern is provided on an attenuating phase-shifting photomask. An aerial image is obtained of the contact hole pattern. The critical dimension of the contact hole pattern is predicted from the intensity of the aerial image. Thereafter, the critical dimension is adjusted by forming non-printable optical proximity or scattering bar correction patterns around abnormal defects in the contact hole pattern on the attenuated phase-shifting photomask. The non-printable correction patterns enhance or cancel light intensity to correct the adnormal defects.

BRIEF DESCRIPTION OF THE DRAWINGS

In the accompanying drawings forming a material part of this description, there is shown:

FIG. 1 illustrates in top view a focused ion beam (FIB) repair method of the prior art.

FIGS. 2A and 2B schematically illustrate in cross-sectional representation an attenuated phase-shifting mask.

DESCRIPTION OF THE PREFERRED EMBODIMENTS

Figures 3A, 3B:
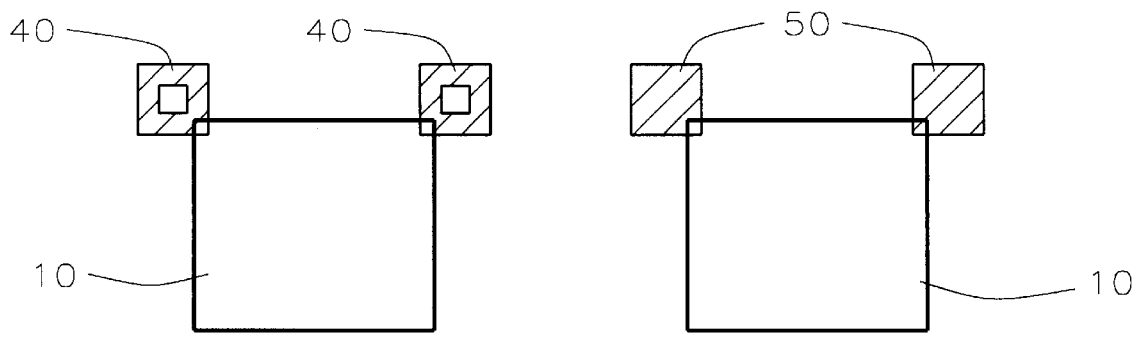
FIGS. 3A through 3E schematically illustrate in top-view a preferred embodiment of the present invention.

The present invention provides a method of repairing a photomask. The method utilizes an optical proximity correction (OPC)-like pattern to control critical dimension (CD) by repaired deposition or etching of patterns on the mask. The repair method of the present invention can be used for a variety of photomasks, including binary masks and phase-shifting masks. The invention will be described for the case of an attenuated phase-shifted photomask. It will be understood by those skilled in the art that the invention should not be limited to the type of mask herein shown and described, but may be extended and applied to a variety of mask types.

Referring now to FIG. 2A, there is shown an illustration of an attenuated phase-shifted photomask (PSM). The substrate 10 is a quartz plate. A layer 12 of chromium has been deposited on the substrate 10. A phase-shifting layer 14 of MoSiON has been deposited overlying the chromium layer 12. A layer of E-beam resist 16 is coated over the phase-shifting layer. The pattern is transferred to the chromium layer 12 and to the phase-shifting layer 14. The completed PSM is illustrated in FIG. 2B. Layer 18 comprises chromium and a portion of the phase-shifting layer. The process of the present invention will now be described to correct abnormal defects in the photomask. Abnormal defects are those in which the contact hole size is correct, but the abnormal holes may get either too much or not enough light intensity compared to normal holes.

The attenuated PSM is based on the absorptive phase shifter which meets both requirements of 180 degree phase shift and 6% transmittance. Therefore, we can use the phase reverse and the 6% transmittance to control the aerial image contribution from our designed OPC around the patterns. As shown in FIG. 3, we use the deposition function of repair machines to deposit OPC patterns on the corner of the patterns and scattering bar (SB) patterns next to or one space from the patterns. FIG. 3 illustrates in top view patterns 10, corresponding to the uncovered quartz areas 10 in FIG. 2B.

In FIGS. 3A and 3B, OPC patterns 40 and 50, respectively, have been deposited next to the contact opening pattern 10. In FIG. 3A, the center of the pattern 40 has been etched away. This will enhance the light intensity of the abnormal hole so that the correct critical dimension will be realized. In FIG. 3B, the pattern 50 is not etched. This will reduce the light intensity so that a smaller critical dimension is achieved.

Figures 3C, 3D:
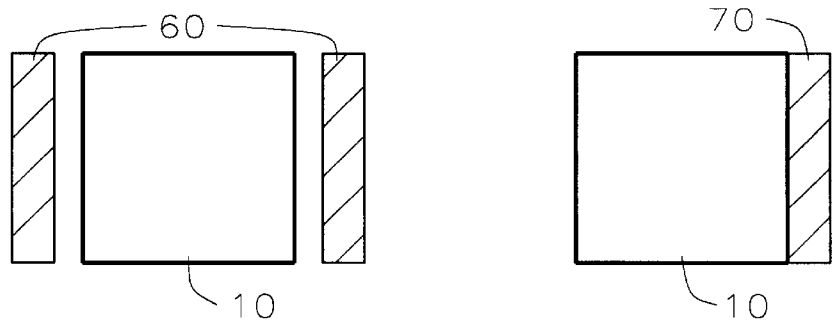
Figure 3E:
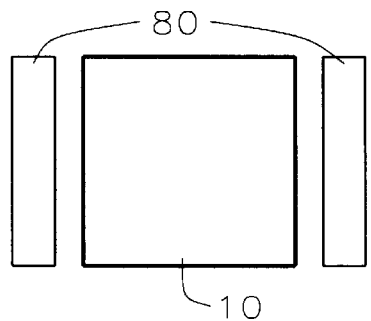

In FIGS. 3C through 3E, SB patterns have been deposited next to or one space from the contact opening pattern 10. In FIG. 3C, the SB pattern 60 is deposited one space away from the contact opening pattern on two opposite sides. This will enhance light intensity of the hole 10. In FIG. 3D, the SB pattern 70 is deposited next to the contact opening pattern 10 on one side. This will reduce the light intensity of the hole 10. In FIG. 3E, the SB pattern 80 is etched one space away from the contact opening 10. This will enhance light intensity.

The FIB mask image is observed after repair and the aerial image is measured by micro-lithography simulation microscope (MSM). From the intensity of the aerial image, the critical dimension value can be predicted. We can select the site and number of pattern depositions or etchings to control CD and pattern symmetry. It is an interesting observation that the CD will be larger when the SB pattern is deposited one space away from the pattern while the CD will be smaller when the SB pattern is deposited just next to the pattern. OPC can also be used to etch the corner of the pattern to get a larger pattern. Light intensity is enhanced or canceled due to diffraction of the OPC pattern. No matter what the repaired shape on the FIB image, we can get an almost symmetrical shape based on the aerial image of MSM. However, when several OPC are etched on different corners of the pattern, non-symmetric shapes are achieved. This approach can be used to repair non-symmetric patterns.

The process of the present invention creates non-printable optical proximity correction patterns or scattering bar patterns around the abnormal defects on a photomask by either the etching or the deposition function of a repair machine. These OPC or SB patterns will contribute light intensity or cancel the light intensity of abnormal defects allowing the designer to adjust the critical dimension by this repair method.

The process of the present invention can be operated easily by a technician on production sites. Not only can PSM repair be achieved, but the process window can also be enhanced by this method. It has been found that the MSM image correlates very closely to the actual contact opening on the wafer. It has been found that holes repaired by the process of the present invention can achieve good depth of focus and that the repaired holes have reduced critical dimension variation on defocused conditions.

While the invention has been particularly shown and described with reference to the preferred embodiments thereof, it will be understood by those skilled in the art that various changes in form and details may be made without departing from the spirit and scope of the invention.

What is claimed is:

1. The method of repairing abnormal defects in an photomask comprising:

providing a contact hole pattern on a photomask;

obtaining an aerial image of said contact hole pattern;

predicting critical dimension of said contact hole pattern from the light intensity of said aerial image wherein an abnormal defect occurs when said contact hole pattern is of a correct size but said light intensity is more or less than light intensity from a normal contact hole pattern; and thereafter adjusting said critical dimension of an abnormal defect by forming non-printable correction patterns around said abnormal defect in said contact hole pattern on said photomask.

2. The method according to claim 1 wherein said photomask is selected from the group containing: phase-shifting photomasks, attenuated phase-shifting photomasks, and binary photomasks.

3. The method according to claim 1 wherein said step of obtaining said aerial image comprises using a micro-lithography simulation microscope.

4. The method according to claim 1 wherein said non-printable correction patterns are selected from the group containing: optical proximity patterns and scattering bar patterns.

5. The method according to claim 1 wherein said non-printable correction patterns are optical proximity correction patterns formed by deposition or etching on corners of said contact hole pattern.

6. The method according to claim 5 wherein said optical proximity correction patterns deposited on said corners of said contact hole pattern enhance light intensity of said abnormal defects to achieve a larger critical dimension than an uncorrected said contact hole pattern.

7. The method according to claim 5 wherein said optical proximity correction patterns deposited on said corners of said contact hole pattern wherein central areas of said optical proximity correction patterns are etched away cancel light intensity of said abnormal defects to achieve a smaller critical dimension than an uncorrected said contact hole pattern.

8. The method according to claim 1 wherein said non-printable correction patterns are scattering bar correction patterns formed by deposition or etching next to said contact hole pattern.

9. The method according to claim 8 wherein light intensity will be enhanced whereby said critical dimension will be larger when said non-printable correction patterns are formed a space away from said contact hole pattern.

10. The method according to claim 8 wherein light intensity will be canceled whereby said critical dimension will be smaller when said non-printable correction patterns are formed immediately next to said contact hole pattern.

11. The method of repairing abnormal defects in an attenuating phase-shifting photomask comprising:

provide a contact hole pattern on an attenuating phase-shifting photomask;

obtaining an aerial image of said contact hole pattern;

predicting critical dimension of said contact hole pattern from the light intensity of said aerial image wherein an abnormal defect occurs when said contact hole pattern is of a correct size but said light intensity is more or less than light intensity from a normal contact hole pattern; and thereafter adjusting said critical dimension of an abnormal defect by forming non-printable correction patterns around said abnormal defect in said contact hole pattern on said attenuated phase-shifting photomask wherein said non-printable correction patterns are optical proximity patterns deposited on said corners of said contact hole pattern wherein said non-printable correction patterns enhance light intensity of said abnormal defect to achieve a larger critical dimension than an uncorrected said contact hole pattern and wherein when central areas of said optical proximity correction patterns are etched away, said optical proximity correction patterns cancel light intensity of said abnormal defect to achieve a smaller critical dimension than an uncorrected said contact hole pattern to thereby adjust critical dimension of said contact hole pattern.

12. The method according to claim 11 wherein said step of obtaining said aerial image comprises using a microlithography simulation microscope.

13. The method according to claim 11 wherein said non-printable correction patterns are optical proximity correction patterns formed by deposition or etching on corners of said contact hole pattern.

14. The method of repairing abnormal defects in an attenuating phase-shifting photomask comprising:

providing a contact hole pattern on an attenuating phase-shifting photomask;

obtaining an aerial image of said contact hole pattern;

predicting critical dimension of said contact hole pattern from the light intensity of said aerial image wherein an abnormal defect occurs when said contact hole pattern is of a correct size but said light intensity is more or less than light intensity from a normal contact hole pattern; and thereafter adjusting said critical dimension of an abnormal defect by forming non-printable correction patterns around said abnormal defect in said contact hole pattern on said attenuated phase-shifting photomask wherein said non-printable correction patterns are scattering bar patterns and wherein said non-printable correction patterns enhance light intensity whereby said critical dimension will be larger when said non-printable correction patterns are formed a space away from said contact hole pattern and wherein said non-printable correction patterns cancel light intensity whereby said critical dimension will be smaller when said non-printable correction patterns are formed immediately next to said contact hole pattern to thereby adjust critical dimension of said contact hole pattern.

15. The method according to claim 14 wherein said step of obtaining said aerial image comprises using a microlithography simulation microscope.

16. The method according to claim 14 wherein said non-printable correction patterns are scattering bar correction patterns formed by deposition or etching next to said contact hole pattern.

\* \* \* \* \*